(12) United States Patent
Lee et al.

(10) Patent No.: US 11,944,998 B2
(45) Date of Patent: Apr. 2, 2024

(54) CAPACITIVE MICROMACHINED ULTRASONIC TRANSDUCER AND METHOD OF FABRICATING THE SAME

(71) Applicant: KOREA INSTITUTE OF SCIENCE AND TECHNOLOGY, Seoul (KR)

(72) Inventors: Byung Chul Lee, Seoul (KR); Dong-Hyun Kang, Seoul (KR); Jin soo Park, Seoul (KR); Tae Song Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 1051 days.

(21) Appl. No.: 16/822,018

(22) Filed: Mar. 18, 2020

(65) Prior Publication Data
US 2020/0298275 A1  Sep. 24, 2020

(30) Foreign Application Priority Data

Mar. 20, 2019 (KR) ........................ 10-2019-0031852

(51) Int. Cl.
*B06B 1/02* (2006.01)
*B81B 3/00* (2006.01)
*B81C 1/00* (2006.01)

(52) U.S. Cl.
CPC .......... *B06B 1/0292* (2013.01); *B81B 3/0086* (2013.01); *B81C 1/00698* (2013.01);
(Continued)

(58) Field of Classification Search
CPC ............... B06B 1/0292; B81B 3/0086; B81B 2201/0271; B81B 2207/07;
(Continued)

(56) References Cited

U.S. PATENT DOCUMENTS

2004/0085858 A1* 5/2004 Khuri-Yakub ...... B81C 1/00158
367/181

FOREIGN PATENT DOCUMENTS

JP         2013138411 A      7/2013
KR   10-1999-0005811    *  6/1997
(Continued)

OTHER PUBLICATIONS

Korean Office Action for Application No. 10-2019-0031852 dated May 12, 2020. In conformance with MPEP 609—Concise explanation of the relevance includes issue date of KR OA and references cited therein.

*Primary Examiner* — Timor Karimy
(74) *Attorney, Agent, or Firm* — CANTOR COLBURN LLP

(57) ABSTRACT

A method of fabricating a capacitive micromachined ultrasonic transducer (CMUT) according to one aspect of the present invention may include forming, on a semiconductor substrate, a first region implanted with impurity ions at a first average concentration and a second region implanted with no impurity ions or implanted with the impurity ions at a second average concentration lower than the first average concentration, forming an insulating layer by oxidizing the semiconductor substrate wherein the insulating layer includes a first oxide layer having a first thickness on at least a part of the first region and a second oxide layer having a second thickness smaller than the first thickness on at least a part of the second region, and forming a membrane layer on the insulating layer such that a gap is defined between the second oxide layer and the membrane layer.

11 Claims, 9 Drawing Sheets

(52) U.S. Cl.
CPC .............. *B81B 2201/0271* (2013.01); *B81B 2203/0127* (2013.01); *B81B 2207/07* (2013.01); *B81C 2201/0171* (2013.01); *B81C 2201/0178* (2013.01); *B81C 2201/0194* (2013.01)

(58) Field of Classification Search
CPC ........ B81B 2203/0127; B81C 1/00698; B81C 2201/0171; B81C 2201/0178; B81C 2201/0194
See application file for complete search history.

(56) References Cited

FOREIGN PATENT DOCUMENTS

| | | |
|---|---|---|
| KR | 1019990005811 A | 1/1999 |
| KR | 1020170029497 A | 3/2017 |
| KR | 1020180030777 A | 3/2018 |

* cited by examiner

CAPACITIVE MICROMACHINED ULTRASONIC TRANSDUCER AND METHOD OF FABRICATING THE SAME

CROSS-REFERENCE TO RELATED APPLICATION(S)

This application claims the benefit under 35 USC § 119(a) of Korean Patent Application No. 10-2019-0031852, filed on Mar. 20, 2019, in the Korean Intellectual Property Office, the entire disclosure of which is incorporated herein by reference for all purposes.

BACKGROUND

1. Field

The following description relates to an ultrasonic device, and particularly, to a capacitive micromachined ultrasonic transducer (CMUT) and a method of fabricating the same.

2. Description of Related Art

An ultrasonic transducer (or an ultrasonic probe) refers to a device that converts an electrical signal into an ultrasonic signal or converts an ultrasonic signal into an electrical signal. Conventionally, a piezoelectric micromachined ultrasonic transducer (PMUT), which processes ultrasonic signals using piezoelectric materials, has been well used. However, recently, research is being conducted on a capacitive micromachined ultrasonic transducer (CMUT), which can extend the operating frequency range and widen a bandwidth of a transducer and can be integrated through a semiconductor process.

In the case of the existing CMUT, however, there is a difficulty in that an oxidation process has to be performed at least twice in order to form an insulating layer used for insulating an upper electrode and a lower electrode while supporting a membrane, which hinders controlling the thickness of the entire wafer.

PRIOR ART DOCUMENTS

Patent Documents (Patent Document 1) 1. Korean Laid-open Patent Publication No. 10-2017-0029497 (Mar. 15, 2017)
(Patent Document 2) 2. Korean Laid-open Patent Publication No. 10-2018-0030777 (Mar. 26, 2018)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The present invention has been devised to solve various problems including the aforementioned problem and to provide a capacitive micromachined ultrasonic transducer (CMUT) and a method of fabricating the same, which can control parasitic capacitance while simplifying the insulation process to enhance economic feasibility. However, the objectives of the present invention are merely exemplary, and the scope of the present invention is not limited by these objectives.

In one general aspect, there is provided a method of fabricating a capacitive micromachined ultrasonic transducer (CMUT), including forming, on a semiconductor substrate, a first region implanted with impurity ions at a first average concentration and a second region implanted with no impurity ions or implanted with the impurity ions at a second average concentration lower than the first average concentration, forming an insulating layer by oxidizing the semiconductor substrate wherein the insulating layer includes a first oxide layer having a first thickness on at least a part of the first region and a second oxide layer having a second thickness smaller than the first thickness on at least a part of the second region, and forming a membrane layer on the insulating layer such that a gap is defined between the second oxide layer and the membrane layer.

The membrane layer may be supported by the first oxide layer.

The forming of the first region and the second region may include forming a first mask layer that exposes the first region and covers the second region on the semiconductor substrate and implanting the impurity ions into the first region at the first average concentration using the first mask layer as an ion implantation protection layer.

The semiconductor substrate may be doped as a first conductive type and the impurity ions may be of a second conductive type opposite to the first conductive type.

The method may further include forming, on the semiconductor substrate, a third region implanted with the impurity ions at a third average concentration higher than the first average concentration, wherein in the forming of the insulating layer, the insulating layer is formed to further include a third oxide layer having a third thickness greater than the first thickness on at least a part of the third region, in the forming of the membrane layer, the gap is further defined between the first oxide layer and the membrane layer, and the membrane layer is supported by the third oxide layer.

The forming of the first region, the second region, and the third region on the semiconductor substrate may include forming a second mask layer that exposes the first region and the third region and covers the second region, implanting the impurity ions into the first region and the third region at the first average concentration by using the second mask layer as an ion implantation protection layer, forming a third mask layer that exposes the third region and covers the first region and the second region, and implanting the impurity ions into the third region by using the third mask layer as an ion implantation protection layer such that an ion implantation concentration of the third region becomes the third average concentration.

In the semiconductor substrate, a structure in which the first region and the second region are sequentially disposed at each side of the third region may be repeated, and in the insulating layer, a structure in which the first oxide layer and the second oxide layer are sequentially disposed at each side of the third oxide layer may be repeated.

In the semiconductor substrate, a structure in which the second region and the first region are respectively disposed at both sides of the third region may be repeated, and in the insulating layer, a structure in which the second oxide layer and the first oxide layer are respectively disposed at both sides of the third oxide layer may be repeated.

In the forming of the second region, the second region may be formed such that a concentration of the impurity ions gradually rises from a middle of the second region to both ends, and in the forming of the insulating layer, the second oxide layer may be formed such that a thickness thereof gradually increases from a middle of the second region to both ends.

The forming of the second region may include forming a fourth mask layer that exposes the first region and covers the second region such that a thickness of the fourth mask layer is gradually decreased from the middle of the second region to both ends and implanting the impurity ions into the semiconductor substrate by using the fourth mask layer as an ion implantation protection layer.

The forming of the membrane layer may include bonding a handle substrate including the membrane layer to the insulating layer of the semiconductor substrate and separating the handle substrate from the insulating layer while leaving the membrane layer on the insulating layer.

The method may further include forming an upper wiring on the membrane layer and forming a lower wiring penetrating through the membrane layer and the insulating layer and being connected to the semiconductor substrate.

In another general aspect, there is provided a CMUT including a semiconductor substrate which includes a first region implanted with impurity ions at a first concentration and a second region implanted with no impurity ions or implanted with the impurity ions at a second concentration lower than the first concentration, an insulating layer which is formed by oxidizing the semiconductor substrate and includes a first oxide layer having a first thickness on at least a part of the first region and a second oxide layer having a second thickness smaller than the first thickness on at least a part of the second region, and a membrane layer formed on the insulating layer, wherein the membrane layer is formed such that a gap is defined between the second oxide layer and the membrane layer.

The semiconductor substrate may be doped as a first conductive type, the impurity ions may be of a second conductive type opposite to the first conductive type, a first voltage may be applied between the semiconductor substrate and the first region, and a second voltage may be applied between the semiconductor substrate and the membrane layer.

The semiconductor substrate may further include a third region implanted with the impurity ions at a third concentration higher than the first concentration, the insulating layer may further include a third oxide layer having a third thickness greater than the first thickness on at least a part of the third region, the gap may be further defined between the first insulating layer and the membrane layer, and the membrane layer may be supported by the third insulating layer.

The second region may be formed such that a concentration of the impurity ions increases from a middle of the second region to both ends, and the second oxide layer may be formed such that a thickness thereof gradually increases from a middle of the second region to both ends.

Other features and aspects will be apparent from the following detailed description, the drawings, and the claims.

Figure 1:
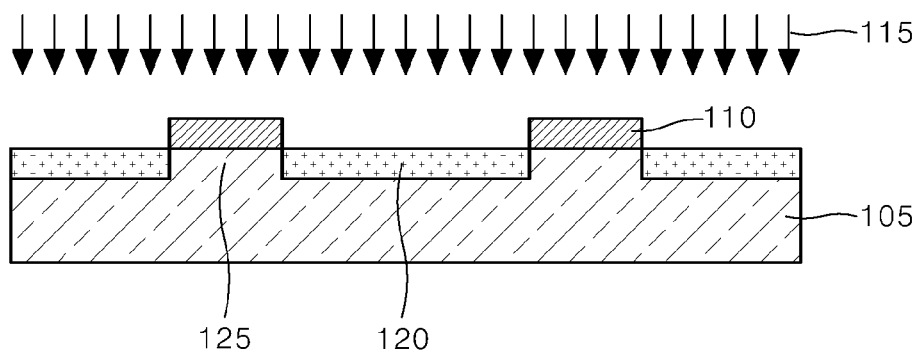
FIGS. 1 to 6 are schematic cross-sectional views showing a capacitive micromachined ultrasonic transducer (CMUT) and a method of fabricating the same according to one embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

FIGS. 1 to 6 are schematic cross-sectional views showing a capacitive micromachined ultrasonic transducer (CMUT) and a method of fabricating the same according to one embodiment of the present invention.

Referring to FIG. 1, a first region 120 and a second region 125 may be formed on a semiconductor substrate 105 such that the first and second regions 120 and 125 have different concentration of impurity ions 115. For example, the first region 120 may be implanted with the impurity ions 115 at a first average concentration, and the second region 125 may be implanted with no impurity ions 115 or implanted with the impurity ions 115 at a second average concentration lower than the first average concentration.

For example, the semiconductor substrate 105 may include a semiconductor material, such as, silicon, germanium, silicon-germanium, or the like. Such a semiconductor material may be doped as n-type or p-type to have conductivity. Furthermore, the semiconductor substrate 105 may be provided by processing a semiconductor wafer to have a predetermined thickness.

More specifically, an operation of forming the first region 120 and the second region 125 may include an operation of forming a first mask layer 110 that exposes the first region 120 on the semiconductor substrate 105 and covers the second region 125 and an operation of implanting the impurity ions 115 into the first region 120 at the first average concentration using the first mask layer 110 as an ion implantation protection layer.

For example, the first mask layer 110 may be formed by forming a photoresist layer (not shown) on the semiconductor substrate 105 and thereafter patterning using photolithography. The first mask layer 110 may prevent the impurity ions 115 from being implanted into the second region in the ion implantation process or allow a relatively smaller amount of impurity ions 115 to be implanted into the second region 125 compared to the first region 120. The impurity ions 115 may affect the oxidation rate of the semiconductor substrate 105 and may include, for example, As ions, P ions, $BF_2$ ions, and the like.

Figure 2:
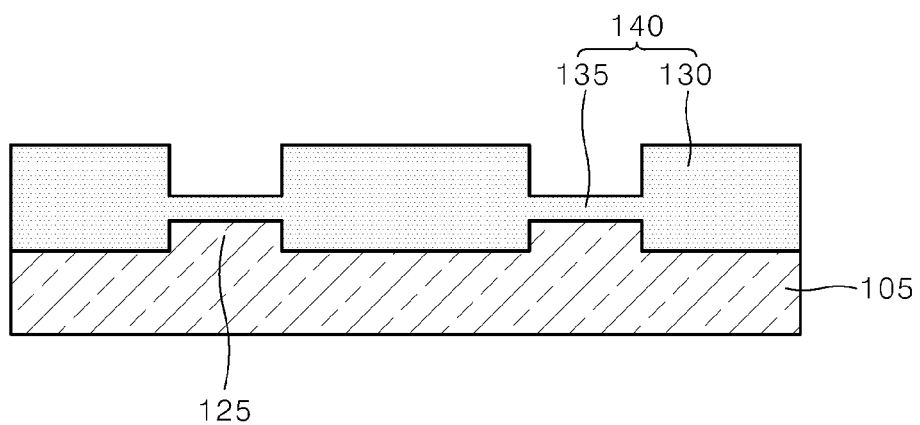

Referring to FIG. 2, the semiconductor substrate 105 may be oxidized to form an insulating layer 140 including a first oxide layer 130 having a first thickness on at least a part of the first region 120 and a second oxide layer 135 having a second thickness on at least a part of the second region 125, wherein the second thickness is smaller than the first thickness. The relatively thick first oxide layer 130 may serve as an insulating portion having parasitic capacitance in the CMUT. For example, the first oxide layer 130 may be formed at a predetermined depth from the surface in the first region 120 and the second oxide layer 135 may be formed at a predetermined depth from the surface in the second region 125.

The oxidation rates of the first region 120 and the second region 125 may be different from each other depending on the degree of implantation of the impurity ions 115. For example, the first region 120 having a relatively high implantation concentration of impurity ions 115 may have an increased crystal defect, such as an increased degree of amorphization, compared to the second region 125, which may result in a faster oxidation rate. Accordingly, by varying the implantation concentration of ions, the first oxide layer 130 and the second oxide layer 135 that have different oxidation thicknesses may be simultaneously formed by one oxidation process.

The above oxidation process is simplified compared to the conventional two oxidation processes and thus is economical. Furthermore, by varying the concentration difference of the impurity ions 115, the thicknesses of the first oxide layer 130 and the second oxide layer 135 may be differently adjusted to a desired ratio.

Figure 3:
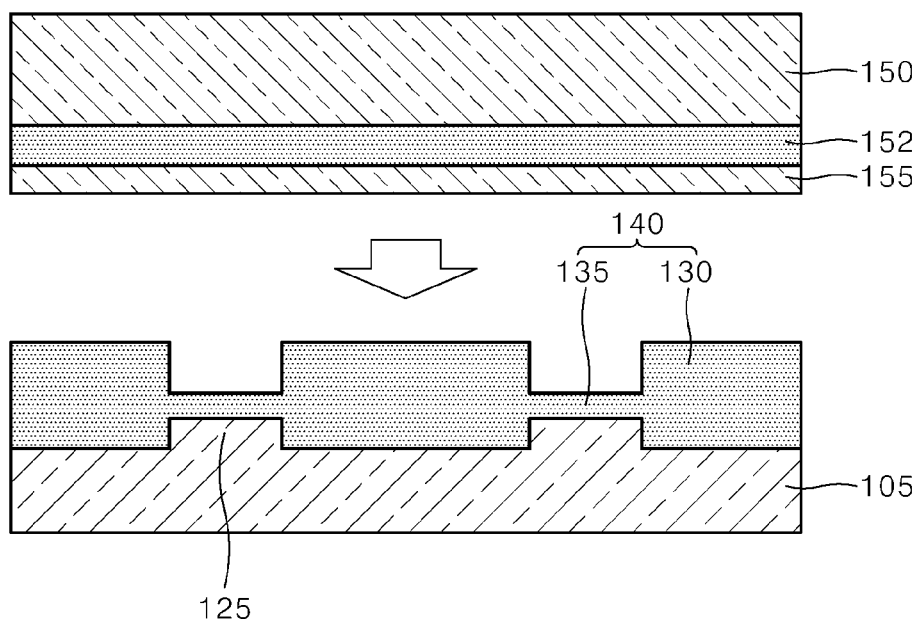
Figure 4:
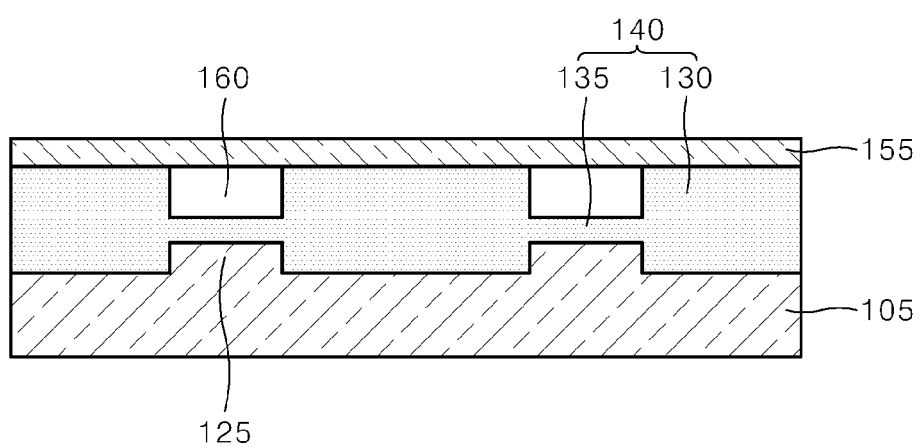

Referring to FIGS. 3 and 4, a membrane layer 155 may be formed on the insulating layer 140. For example, the insulating layer 140 may be supported by the first oxide layer 130 that is relatively thick, and a gap 160 may be defined between the relatively thin second oxide layer 135 and the membrane layer 155.

More specifically, as shown in FIG. 3, a handle substrate 150 including the membrane layer 155 may be bonded onto the insulating layer 140 of the semiconductor substrate 105. A separation layer 152 may be formed between the handle substrate 150 and the membrane layer 155. Then, the handle substrate 150 may be separated while leaving the membrane layer 155 on the insulating layer 140. For example, the handle substrate 150 may be separated from the membrane layer 155 via the separation layer 152 so that, as shown in FIG. 4, a structure in which the membrane layer 155 is adhered to the insulating layer 140 can be formed.

Figure 5:
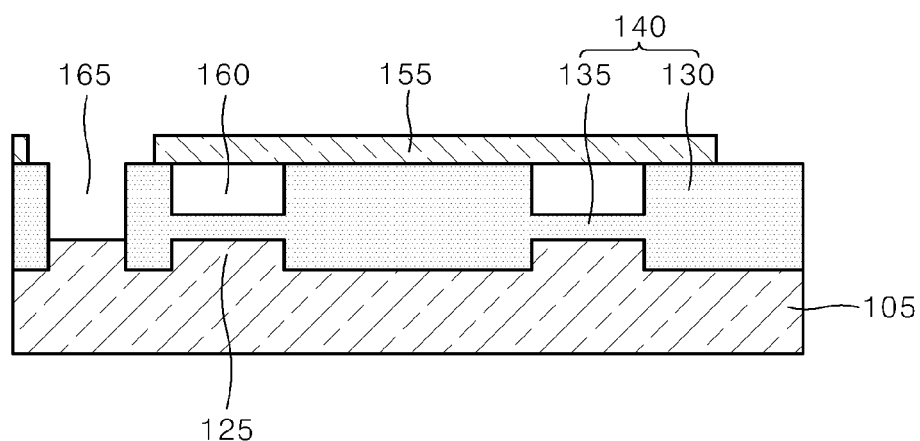
Figure 6:
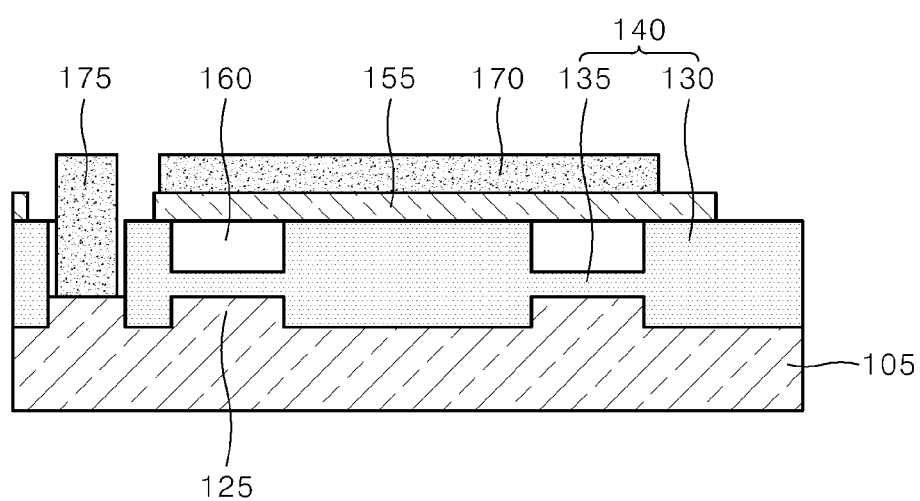

Additionally, referring to FIGS. 5 and 6, an upper wiring 170 may be formed on the membrane layer 155 and a lower wiring 175 that penetrates through the membrane layer 155 and the insulating layer 140 and is connected to the semiconductor substrate 105 may be formed. The upper wiring 170 and the lower wiring 175 may serve as a power source or a ground connector and may be formed of a conductive material, such as metal, doped polysilicon, or the like. Optionally, the upper wiring 170 may be referred to as an upper electrode and the lower wiring 175 may be referred to as a lower electrode.

More specifically, as shown in FIG. 5, a via hole 165 penetrating the membrane layer 155 and the insulating layer 140 may be formed. For example, an upper portion of the via hole 165 may be formed in the membrane layer 155 using photolithography and etching process and then a lower portion of the via hole 165 may be formed in the first oxide layer 130 using photolithography and etching process.

Thereafter, as shown in FIG. 6, a wiring layer may be formed and patterned to form the upper wiring 170 and the lower wiring 175.

As shown in FIGS. 1 to 6, the CMUT according to the present embodiment may include the semiconductor substrate 105 including the first region 120 implanted with the impurity ions 115 at the first average concentration and the second region 125 implanted with no impurity ions 115 or implanted with the impurity ions 115 at the second average concentration lower than the first average concentration; the insulating layer 140 which is formed by oxidizing the semiconductor substrate 105 and includes the first oxide layer 130 having the first thickness on at least a part of the first region 120 and the second oxide layer 135 having the second thickness on at least a part of the second region 125, wherein the second thickness is smaller than the first thickness; and the membrane layer 155 formed on the insulating layer 140.

Further, the CMUT may further include the upper wiring 170 formed on the membrane layer 155 and the lower wiring 175 which penetrates through the membrane layer 155 and the insulating layer 140 and is connected to the semiconductor substrate 105.

Figure 7:
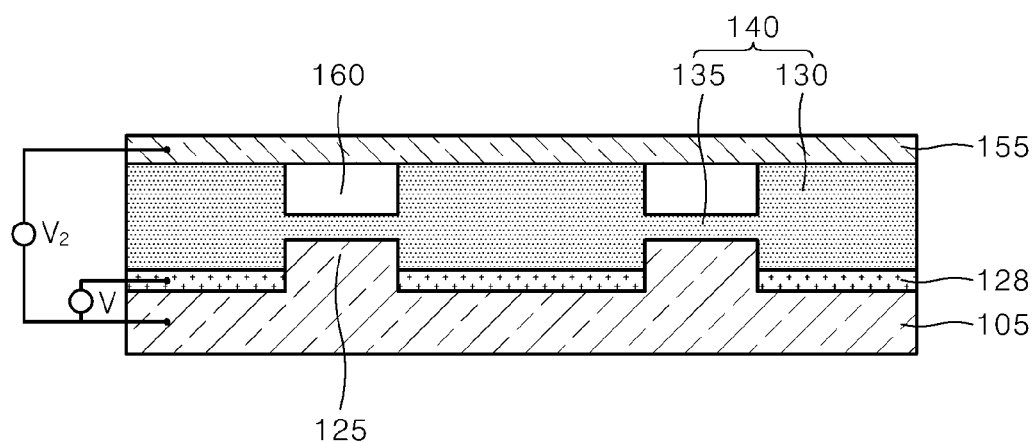
FIG. 7 is a schematic diagram showing an application of a CMUT according to one embodiment of the present invention.

FIG. 7 is a schematic diagram showing an application of a CMUT according to one embodiment of the present invention.

Referring to FIG. 7, a semiconductor substrate 105 may be doped with a first conductive type, impurity ions 115 may be of a second conductive type that is opposite to the first conductive type, a first voltage $V_1$ may be applied between the semiconductor substrate 105 and a first region 120, and a second voltage $V_2$ may be applied between the semiconductor substrate 105 and a membrane layer 155.

For example, in a case where the semiconductor substrate 105 is doped as p-type, the first region 120 may be doped as n+ type. The first region 120 may have at least an n+ type doped region remaining below the first oxide layer 130. In this case, a first power source $V_1$ may be connected such that the first region 120 is a positive electrode, and a second power source $V_2$ may be connected such that the membrane layer 155 is a positive electrode.

In another example, in a case where the semiconductor substrate 105 is doped as n-type, the first region 120 may be doped as p+ type. The first region 120 may have at least a p+ type doped region below the first oxide layer 130. In this case, both the first power source V1 and the second power source V2 may be connected such that the semiconductor substrate 105 is a positive electrode.

Accordingly, a pn diode structure may be formed by ion implantation, and the use of the pn diode connection structure may make it possible to lower a substantial electric field applied to the first oxide layer 130, thereby allowing a high electric field, which is higher than a breakdown voltage of an oxide, to be applied between the first oxide layer 130 and the semiconductor substrate 105. In this case, it is possible to reduce the thickness of the first oxide layer 130. Further, parasitic capacitance applied to the first oxide layer 130 may be reduced through the pn junction capacitance, so that sensitivity can be increased by increasing the amount of capacitance variation at the time of operation of the CMUT.

FIGS. 8 to 11 are schematic cross-sectional views showing a CMUT and a method of fabricating the same according to another embodiment of the present invention.

Figure 8:
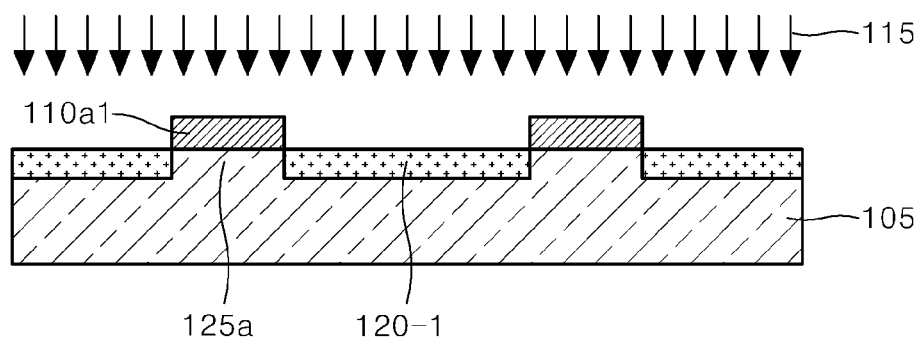
FIGS. 8 to 11 are schematic cross-sectional views showing a CMUT and a method of fabricating the same according to another embodiment of the present invention.
Figure 9:
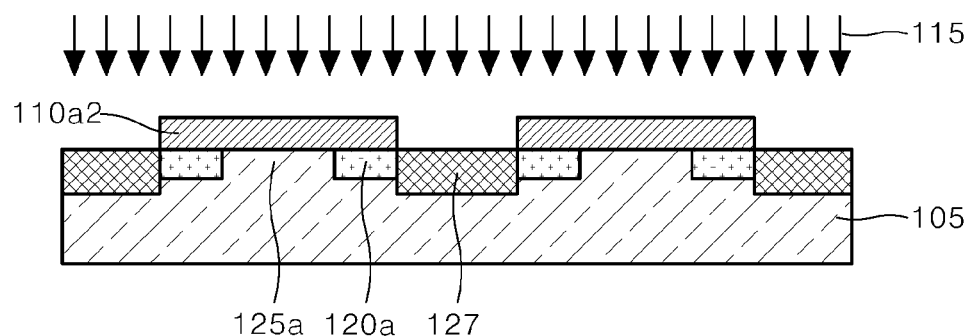

Referring to FIGS. 8 and 9, a first region 120a, a second region 125a, and a third region 127 may be formed on a semiconductor substrate 105 such that the first, second, and third regions 120a, 125a, and 127 have different concentrations of impurity ions 115. The first region 120a may be implanted with impurity ions 115 at a first average concentration, the second region 125a may be implanted with no impurity ions 115 or implanted with the impurity ions 115 at a second average concentration lower than the first average concentration, and the third region 127 may be implanted with the impurity ions 115 at a third average concentration higher than the first average concentration.

For example, as shown in FIG. 8, a second mask layer 110a1 that exposes a doped region 120-1 including the first region 120a and the third region 127 on the semiconductor substrate 105 and covers the second region 125a may be formed. Then, by using the second mask layer 110a1 as an ion implantation protection layer, the doped region 120-1 including the first region 120a and the third region 127 may be implanted with the impurity ions 115 at the first average concentration. Then, the second mask layer 110a1 may be removed.

Referring to FIG. 9, a third mask layer 110a2 that exposes the third region 127 and covers the first region and the second region may be formed. Subsequently, by using the third mask layer 110a2 as an ion implantation protection layer, the third region 127 may be implanted with the impurity ions 115 at the third average concentration. Thus, the first region 120a may be implanted once with the impurity ions 115 and the third region 127 may be implanted twice with the impurity ions 115. Subsequently, the third mask layer 110a2 may be removed.

For example, a structure in which the first region 120a and the second region 125a are sequentially disposed at each side of the first region 127 may be repeated in the semiconductor substrate 105.

Figure 10:
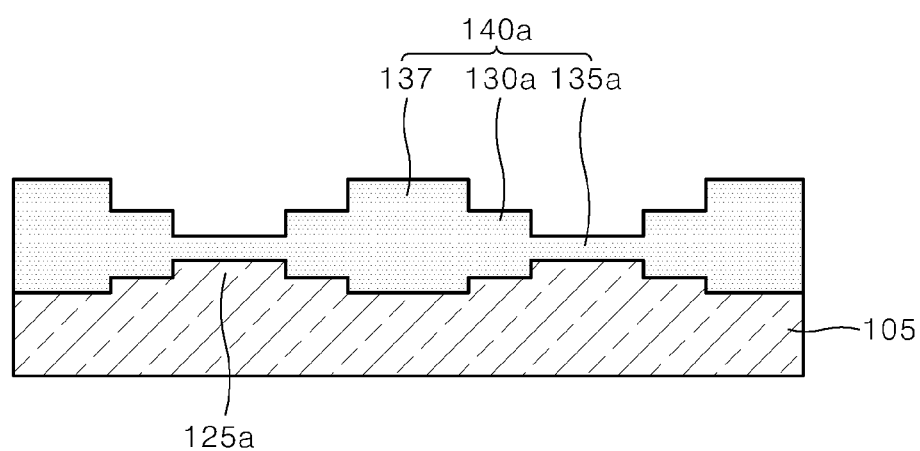

Referring to FIG. 10, an insulating layer 140a including a first oxide layer 130a, a second oxide layer 135a, and a third oxide layer 137 may be formed by oxidizing the semiconductor substrate 105. In the insulating layer 137, a structure in which the first oxide layer 130a and the second oxide layer 135a are sequentially disposed at each side of the third oxide layer 137 may be repeated.

For example, the first oxide layer 130a may be formed to have a first thickness on at least a part of the first region 120a, the second oxide layer 135a may be formed to have a second thickness that is smaller than the first thickness on at least a part of the second region 125a, and the third oxide layer 137 may be formed to have a third thickness that is greater than the first thickness on at least a part of the third region 127.

Figure 11:
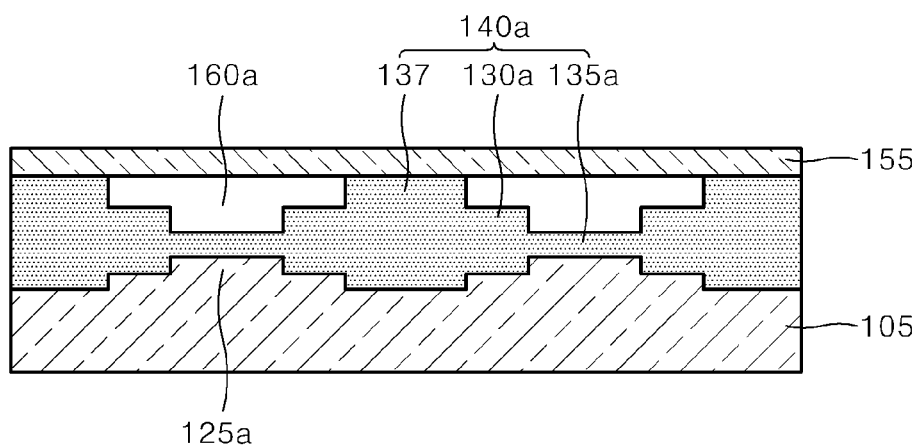

Referring to FIG. 11, a membrane layer 155 may be formed on the insulating layer 140a. The formation of the membrane layer 155 may refer to the description of FIG. 3. According to the description, the membrane layer 155 may be supported by the third oxide layer 137 that is the thickest, and a gap 160a may be defined between the first oxide layer 130a and the membrane layer 155a and between the second oxide layer 135a and the membrane layer 155.

Subsequently, an upper wiring 170 and a lower wiring 175 may be further formed with reference to the descriptions of FIGS. 5 and 6.

According to the present embodiment, through multistage ion implantation, the insulating layer 140a of a multistage structure may be formed so that the CMUT can be operated in multilevel.

Figure 12:
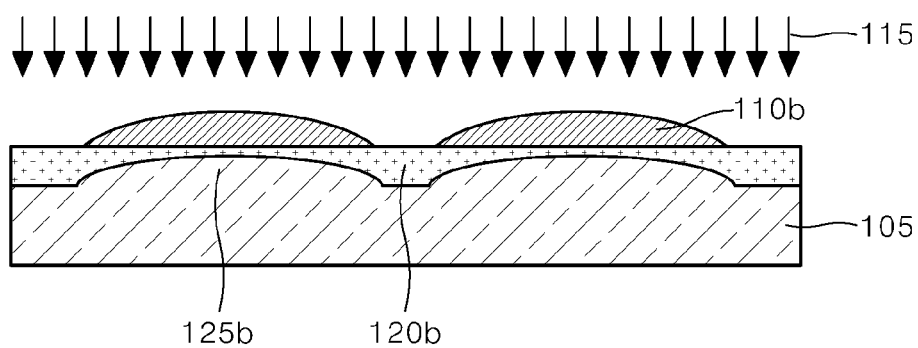
FIGS. 12 to 14 are schematic cross-sectional views showing a CMUT and a method of fabricating the same according to still another embodiment of the present invention.
Figure 13:
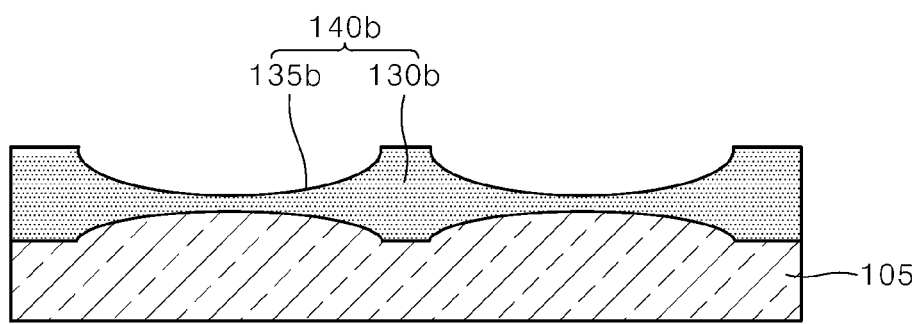
Figure 14:
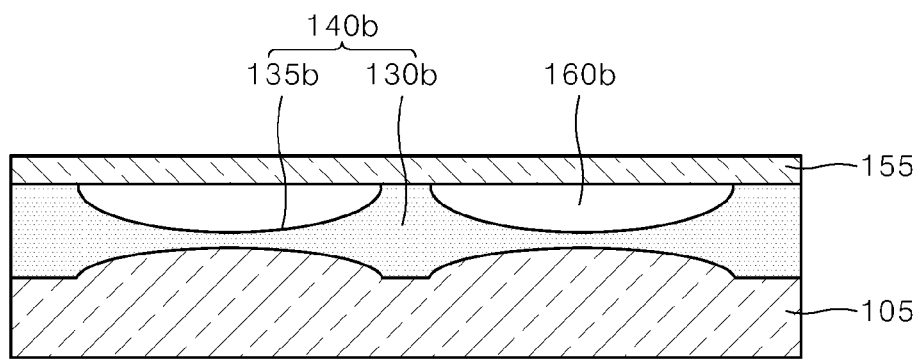

FIGS. 12 to 14 are schematic cross-sectional views showing a CMUT and a method of fabricating the same according to still another embodiment of the present invention.

Referring to FIG. 12, a fourth mask layer 110b that exposes a first region 120b of a semiconductor substrate 105 and covers a second region 125b may be formed to have its thickness decreased from the center of the second region 125b to both ends. Then, by using the fourth mask layer 110b as an ion implantation protection layer, the semiconductor substrate 105 may be implanted with the impurity ions 115.

The first region 120b may be implanted with the impurity ions 115 at a first average concentration, and the second region 125b may be implanted with the impurity ions 115 at a second average concentration lower than the first average concentration, such that the concentration of the impurity ions gradually rises from the middle of the second region 125b to both ends.

Referring to FIG. 13, an insulating layer 140b including a first oxide layer 130b and a second oxide layer 135b may be formed by oxidizing the semiconductor substrate 105. The first oxide layer 130b may be formed to have a first thickness on at least a part of the first region 120b and the second oxide layer 135b may be formed to have a second thickness smaller than the first thickness on at least a part of the second region 125b such that the thickness of the second oxide layer 135b gradually increases from the middle of the second region 125b to both ends.

Referring to FIG. 14, a membrane layer 155 may be formed on the insulating layer 140b. The formation of the membrane layer 155 may refer to the description of FIG. 3. According to the description, the membrane layer 155 may be supported by the first oxide layer 130b that is the thickest, and a gap 160b may be defined between the second oxide layer 135b and the membrane layer 155.

Subsequently, an upper wiring 170 and a lower wiring 175 may be further formed with reference to the descriptions of FIGS. 5 and 6.

According to the present embodiment, the concentration of the impurity ions 115 of the second region 125b may be continuously changed and accordingly the thickness of the second oxide layer 135b may be continuously changed.

FIGS. 15 to 18 are schematic cross-sectional views showing a CMUT and a method of fabricating the same according to yet another embodiment of the present invention.

Figure 15:
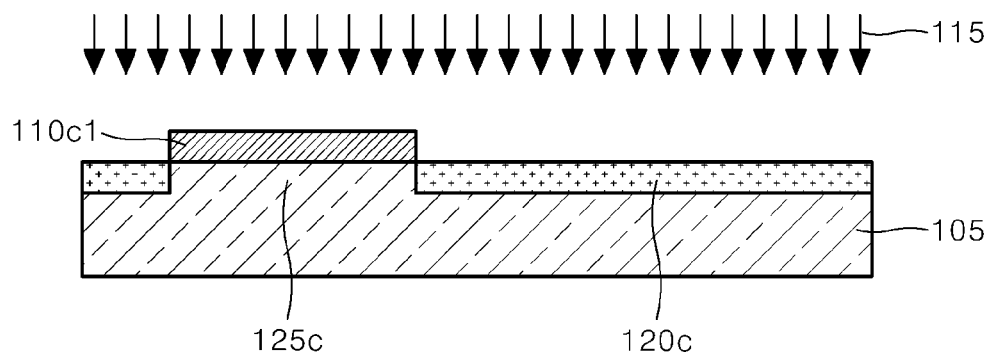
FIGS. 15 to 18 are schematic cross-sectional views showing a CMUT and a method of fabricating the same according to yet another embodiment of the present invention.

Referring to FIG. 15, a second mask layer 110c1 that exposes a doped region 120-2 including a first region 120c and a third region 127c on a semiconductor substrate 105 and covers a second region 125c may be formed.

Then, by using the second mask layer 110c1 as an ion implantation protection layer, the doped region 120-1 including the first region 120c and the third region 127c may be implanted with impurity ions 115.

Figure 16:
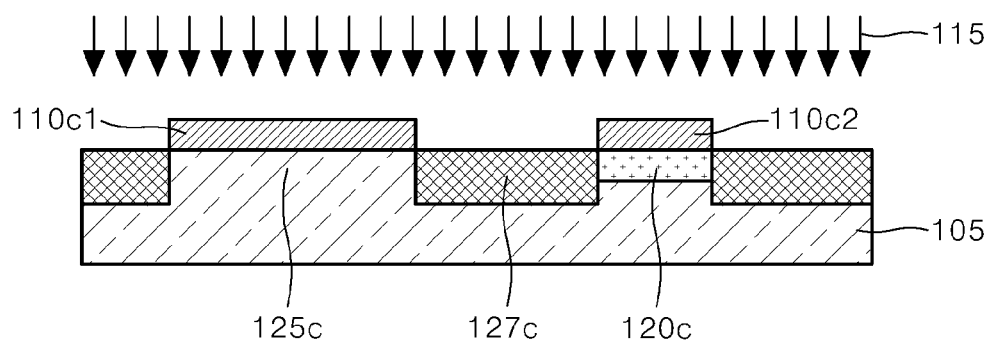

Referring to FIG. 16, the third region 127c may be exposed and a third mask layer 110c2 that covers the first region 120c may be further formed. Subsequently, by using the second mask layer 110c1 and the third mask layer 110c2 as ion implantation protection layers, the third region 127c may be implanted with the impurity ions 115. In the semiconductor substrate 105, a structure in which the second region 125c and the first region 120c are sequentially disposed at each side of the third region 127c may be repeated.

Figure 17:
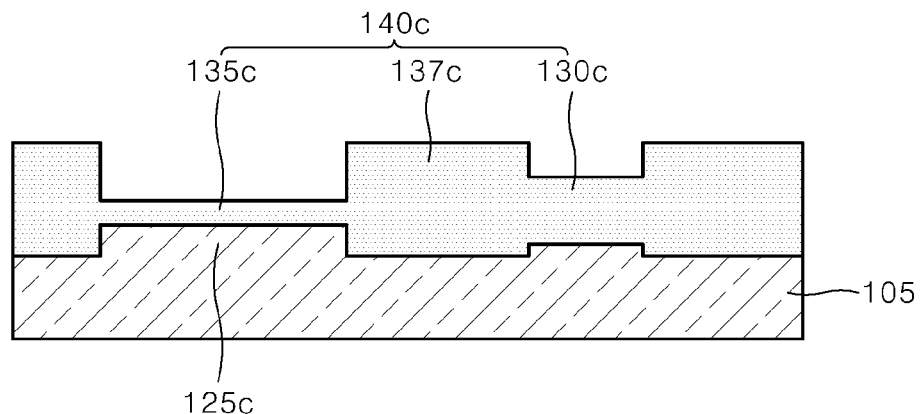

In another example, in FIG. 15, the second mask layer 110c1 may be removed, and in FIG. 17, the third mask layer 110c2 that covers the first region 120c and the second region 125c and exposes the third region 127c may be formed.

Referring to FIG. 17, an insulating layer 140c including a first oxide layer 130c, a second oxide layer 135c, and a third oxide layer 137c may be formed by oxidizing the semiconductor substrate 105. The first oxide layer 130c may be formed to have a first thickness on at least a part of the first region 120c, the second oxide layer 135c may be formed to have a second thickness smaller than the first thickness on at least a part of the second region 125c, and the third oxide layer 137c may be formed to have a third thickness greater than the first thickness on at least a part of the third region 127c.

Accordingly, a structure in which the second oxide layer 135c and the first oxide layer 130c are sequentially disposed at each side of the third oxide layer 137c may be repeated in the insulating layer 140c.

Figure 18:
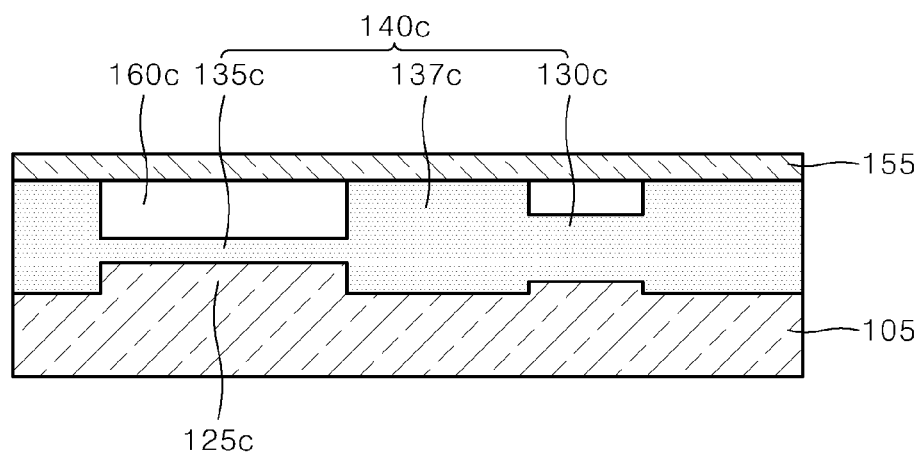

Referring to FIG. 18, a membrane layer 155 may be formed on the insulating layer 140c. The formation of the membrane layer 155 may refer to the description of FIG. 3. The membrane layer 155 may be supported by the third oxide layer 137c that is the thickest and a gap 160c may be defined between the first oxide layer 130c and the membrane layer 155 and between the second oxide layer 135c and the membrane layer 155.

Then, an upper wiring 170 and a lower wiring 175 may be further formed with reference to the descriptions of FIGS. 5 and 6.

The CMUT according to the embodiments of the present invention made as described above may be economically fabricated since the oxide layers of different thicknesses can be formed by implantation of impurity ions. Also, by controlling the concentration distribution of implanted impurity ions, various insulating layer structures may be formed to implement various multilevel operations. It is apparent that the scope of the present invention is not limited by these effects.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

REFERENCE NUMERALS

105: SEMICONDUCTOR SUBSTRATE
120, 120A, 120B, 120C: FIRST REGION
125, 125A, 125B, 125C: SECOND REGION
127, 127C: THIRD REGION
130, 130A, 130B, 130C: FIRST OXIDE LAYER
135, 135A, 135B, 135C: SECOND OXIDE LAYER
137, 137C: THIRD OXIDE LAYER
140, 140A, 140B, 140C: INSULATING LAYER
155: MEMBRANE LAYER
170: UPPER WIRING
176: LOWER WIRING

What is claimed is:

1. A method of fabricating a capacitive micromachined ultrasonic transducer (CMUT), the method comprising:
    forming, on a semiconductor substrate doped as a first conductive type, a first region implanted with impurity ions at a first average concentration and a second region implanted with no impurity ions or implanted with the impurity ions at a second average concentration lower than the first average concentration, wherein the impurity ions are of a second conductive type opposite to the first conductive type, and include at least one of As ion, P ion, and BF2 ion;
    forming an insulating layer by oxidizing the semiconductor substrate, the insulating layer including a first oxide layer having a first thickness on at least a part of the first region and a second oxide layer having a second thickness smaller than the first thickness on at least a part of the second region; and
    forming a membrane layer on the insulating layer such that a gap is defined between the second oxide layer and the membrane layer,
    wherein in the forming of the insulation layer, the first oxide layer and the second oxide layer are simultaneously formed by one oxidation process to have different thicknesses from each other while the first region has a relatively high implantation concentration and a faster oxidation rate than the second region, which has a relatively low implantation concentration.

2. The method of claim 1, wherein the membrane layer is supported by the first oxide layer.

3. The method of claim 1, wherein the forming of the first region and the second region comprises:
    forming a first mask layer that exposes the first region and covers the second region on the semiconductor substrate and
    implanting the impurity ions into the first region at the first average concentration using the first mask layer as an ion implantation protection layer.

4. The method of claim 1, further comprising forming, on the semiconductor substrate, a third region implanted with the impurity ions at a third average concentration higher than the first average concentration,
    wherein:
    in the forming of the insulating layer, the insulating layer is formed to further include a third oxide layer having a third thickness greater than the first thickness on at least a part of the third region,
    in the forming of the membrane layer, the gap is further defined between the first oxide layer and the membrane layer, and
    the membrane layer is supported by the third oxide layer.

5. The method of claim 4, the forming of the first region, the second region, and the third region on the semiconductor substrate comprises:
    forming a second mask layer that exposes the first region and the third region and covers the second region;
    implanting the impurity ions into the first region and the third region at the first average concentration by using the second mask layer as an ion implantation protection layer;
    forming a third mask layer that exposes the third region and covers the first region and the second region; and
    implanting the impurity ions into the third region by using the third mask layer as an ion implantation protection layer such that an ion implantation concentration of the third region becomes the third average concentration.

6. The method of claim 4, wherein:
    in the semiconductor substrate, a structure in which the first region and the second region are sequentially disposed at each side of the third region is repeated, and
    in the insulating layer, a structure in which the first oxide layer and the second oxide layer are sequentially disposed at each side of the third oxide layer is repeated.

7. The method of claim 4, wherein:
    in the semiconductor substrate, a structure in which the second region and the first region are respectively disposed at both sides of the third region is repeated, and in the insulating layer, a structure in which the second oxide layer and the first oxide layer are respectively disposed at both sides of the third oxide layer is repeated.

8. The method of claim 1, wherein:
in the forming of the second region, the second region is formed such that a concentration of the impurity ions gradually rises from a middle of the second region to both ends, and
in the forming of the insulating layer, the second oxide layer is formed such that a thickness thereof gradually increases from a middle of the second region to both ends.

9. The method of claim 8, wherein the forming of the second region comprises:
forming a fourth mask layer that exposes the first region and covers the second region such that a thickness of the fourth mask layer is gradually decreased from the middle of the second region to both ends and implanting the impurity ions into the semiconductor substrate by using the fourth mask layer as an ion implantation protection layer.

10. The method of claim 1, wherein the forming of the membrane layer comprises:
bonding a handle substrate including the membrane layer to the insulating layer of the semiconductor substrate and
separating the handle substrate from the insulating layer while leaving the membrane layer on the insulating layer.

11. The method of claim 1, further comprising forming an upper wiring on the membrane layer and forming a lower wiring penetrating through the membrane layer and the insulating layer and being connected to the semiconductor substrate.

* * * * *